United States Patent
Ma

(10) Patent No.: US 8,963,646 B1
(45) Date of Patent: Feb. 24, 2015

(54) DELAY LINE RING OSCILLATION APPARATUS

(71) Applicant: Yantao Ma, Boise, ID (US)

(72) Inventor: Yantao Ma, Boise, ID (US)

(73) Assignee: Nanya Technology Corporation, Taoyuan (TW)

( * ) Notice: Subject to any disclaimer, the term of this patent is extended or adjusted under 35 U.S.C. 154(b) by 40 days.

(21) Appl. No.: 13/969,627

(22) Filed: Aug. 19, 2013

(51) Int. Cl.
*H03K 3/03* (2006.01)
*H03L 7/06* (2006.01)

(52) U.S. Cl.
CPC ........................................ *H03L 7/06* (2013.01)
USPC .............................. 331/57; 331/1 A; 327/161

(58) Field of Classification Search
USPC ............. 327/158, 161, 277, 284; 331/1 A, 57
See application file for complete search history.

(56) References Cited

U.S. PATENT DOCUMENTS

| | | | | |
|---|---|---|---|---|
| 5,416,444 A * | 5/1995 | Yamauchi et al. | ............... | 331/45 |
| 6,028,488 A * | 2/2000 | Landman et al. | ............. | 331/1 A |
| 6,611,477 B1 * | 8/2003 | Speyer et al. | ................. | 368/113 |
| 7,009,457 B2 * | 3/2006 | Kim | ................................ | 331/57 |
| 7,230,498 B2 * | 6/2007 | Osvaldella | ...................... | 331/57 |
| 7,439,724 B2 * | 10/2008 | Heidel et al. | ............... | 324/76.82 |
| 7,705,687 B1 * | 4/2010 | Paz | ................................... | 331/57 |
| 8,164,966 B2 * | 4/2012 | Stratz et al. | .................. | 365/201 |
| 2003/0098731 A1 * | 5/2003 | Tabatabaei et al. | ........... | 327/160 |
| 2008/0111641 A1 * | 5/2008 | Huang et al. | ................. | 331/1 A |

\* cited by examiner

*Primary Examiner* — Levi Gannon
(74) *Attorney, Agent, or Firm* — Jianq Chyun IP Office

(57) ABSTRACT

The delay line degradation protection architecture as build-in ring oscillation apparatus includes a two gates logical circuit, a buffer, a clock input buffer and a delay lock loop circuit. The two gates logical circuit receives a clock enable signal, specific mode signal, and delayed clock output signal. The two gates logical circuit performs a logical operating on the clock enable signal, the specific mode signal and the delayed clock output signal for generating a mode selecting signal. The buffer generates a feedback signal according to the mode selecting signal and a control signal. The clock input buffer decides whether to transport the input clock signal to an output end of the clock input buffer or not according to the feedback signal. The delay lock loop circuit generates the delayed clock output signal. A frequency of the feedback signal is adjusted according to the control signal.

13 Claims, 4 Drawing Sheets

DELAY LINE RING OSCILLATION APPARATUS

BACKGROUND OF THE INVENTION

1. Field of Invention

The present invention generally relates to a delay line degradation protection architecture, especially with built-in ring oscillation apparatus, and more particularly to an in-system delay line ring oscillation apparatus.

2. Description of Prior Art

When a clock path including a delay lock loop circuits that were in use go into an asymmetric stress condition for the time the clock is not toggled, especially conditions including slow exit power down, self-refresh, or any operations requiring delay lock loop circuit reset aftermath. It is hoped on not going into this type of non-clocking state for long periods of time in the past, or hope even/odd number of random event durations are balanced.

In a dynamic random access memory (DRAM) application, for the issue mentioned above, both duty cycle degradation and a tDQSCK (data signal skew to clock signal) timing shift due to degradation stress mismatch are exposed. The same issue can be seen in the clock distribution tree. The issues impact on DRAM lifetime severely considering servers field application randomness.

SUMMARY OF THE INVENTION

The present disclosure provides a delay line ring oscillation apparatus for extending reliability lifetime concept.

The delay line ring oscillation apparatus provided by the present disclosure includes a two gates logical circuit, a buffer, a clock input buffer and a delay lock loop circuit. The two gates logical circuit has three input ends and an output end. Two of the three input ends respectively receive a clock enable signal and a specific mode signal, and the third input end receiving a delayed clock output signal or a fine delayed output signal. The two gates logical circuit performs a logical operating on the clock enable signal, the specific mode signal and the one of the delayed clock output signal and the fine delayed output signal for generating a mode selecting signal on the output end of the two gates logical circuit. The buffer receives the mode selecting signal and generates a feedback signal according to the mode selecting signal and a control signal. The clock input buffer receives the feedback signal and an input clock signal. The clock input buffer decides whether to transport the input clock signal to an output end of the clock input buffer or not according to the feedback signal. The delay lock loop circuit receives and delays the signal on the output end of the clock input buffer for generating the delayed clock output signal. Wherein, a frequency of the feedback signal is adjusted according to the control signal.

In an embodiment of the disclosure, the two gates logical circuit is an and-or-inverter (AOI) gate. The AOI gate has a NAND input end, a first OR input end and a second OR input end, and an AOI output end. The NAND input end receives a clock enable signal, the first OR input end receives a specific mode signal, and the second OR input end receives the delayed clock output signal or the fine delayed output signal.

In an embodiment of the disclosure, the clock input buffer is a NAND gate. The NAND gate has a first input end a second input end and an output end. The first input end of the NAND gate receives the feedback signal, the second input end of the NAND gate receives the input clock signal, and the output end of the NAND is coupled to the delay lock loop circuit.

In an embodiment of the disclosure, the delay lock loop circuit is a coarse delay lock loop circuit.

In an embodiment of the disclosure, the delay line ring oscillation apparatus further includes a fine delay lock loop circuit. The input is coupled to the coarse delay lock loop circuit. The fine delay lock loop circuit receives a coarse delayed output signal from the coarse delay lock loop circuit. The fine delay lock loop circuit generates the fine delayed output signal according to the coarse delayed output signal.

In an embodiment of the disclosure, the delay line ring oscillation apparatus further includes a NOR gate. The NOR gate is coupled to the two gates logical circuit. Wherein, the NOR gate receives a power down signal, a self-refresh signal and a test mode for negative bias temperature instability (NBTI) signal. The NOR gate is used to generate the specific mode signal.

In an embodiment of the disclosure, the buffer includes a plurality of inverting gates. The inverting gates are coupled in series. The first inverting gate receives the mode selecting signal, and the last inverting gate generates the feedback signal. Each of a plurality of gate delays of each of the inverting gates is controlled by the control signal.

In an embodiment of the disclosure, each of the inverting gates includes a first transistor, a second transistor, a third transistor, a fourth transistor, a first switch and a second switch. The first transistor has a first end, a second end and a control end. The first end of the first transistor is coupled to a first reference voltage, and the control end of the first end is an input end of the inverting gate. The second transistor has a first end, a second end and a control end. The control end of the second transistor is coupled to the control end of the first transistor, and the second end of the second transistor is coupled to a second reference voltage. The third transistor has a first end, a second end and a control end. The first end of the third transistor is coupled to the second end of the first transistor, and the second end of the third transistor is an output end of the inverting gate. The first switch is coupled between the input end of the inverting gate and the control end of the third transistor. The first switch is used to connect the control end of the third transistor to the input end of the inverting gate or the second reference voltage according to the control signal. The fourth transistor has a first end, a second end and a control end. The first end of the fourth transistor is coupled to the output end of the inverting gate, and the second end of the fourth transistor is coupled to the first end of the second transistor. The second switch is coupled between the input end of the inverting gate and the control end of the fourth transistor. The second switch is used to connect the control end of the fourth transistor to the input end of the inverting gate or the first reference voltage according to the control signal.

In an embodiment of the disclosure, each of the inverting gates further includes a first capacitor and a second capacitor. The first capacitor is coupled between the output end of each of the inverting gates and the first reference voltage. The second capacitor is coupled between the output end of each of the inverting gates and the first reference voltage.

In an embodiment of the disclosure, the first capacitor is formed by a N-type transistor, and the second capacitor is formed by a P-type transistor.

In an embodiment of the disclosure, the first transistor and the third transistor are P-type transistors, and the second transistor and the fourth transistor are N-type transistors.

In an embodiment of the disclosure, when the first switch connects the control end of the third transistor to the input end of the inverting gate, the second switch connects the control end of the fourth transistor to the first reference voltage. When the first switch connects the control end of the third transistor to the second reference voltage, the second switch connects the control end of the fourth transistor to the input end of the inverting gate.

In an embodiment of the disclosure, the amount of the inverting gates of the buffer is even.

Accordingly, the present disclosure provides the delay line ring oscillation apparatus with the two gates logical circuit and a buffer which may be used to adjust the frequency of the feedback signal. According to the specific mode signal, the two gates logical circuit, the buffer, the clock input buffer and the delay lock loop circuit form a loop with odd number gates, and a delayed clock output signal with a slow frequency and a stable duty cycle can be generated accordingly. That is, the asymmetrical degradation stress problem of the delay line ring oscillation apparatus can be solved, and the system performance can be extended by making the delay line ring oscillation apparatus safe from negative bias temperature instability (NBTI) and/or positive bias temperature instability (PBTI) hazard.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
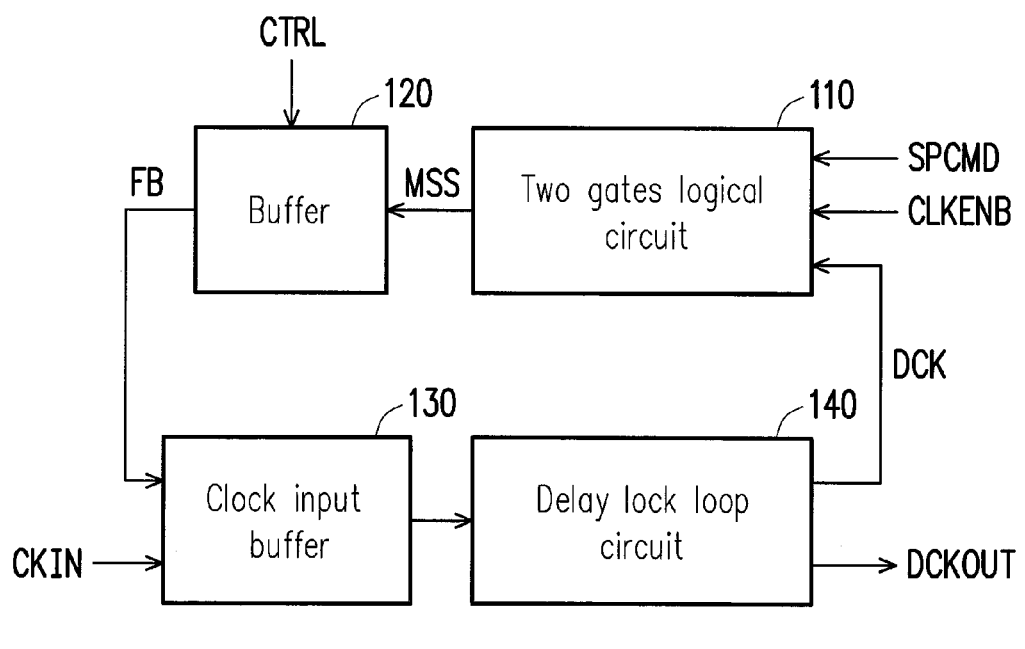
FIG. 1 is a block diagram of a delay line ring oscillation apparatus 100 according to an embodiment of the present disclosure.

Reference will now be made in detail to the present preferred embodiment of the invention, examples of which are illustrated in the accompanying drawings. Wherever possible, the same reference numbers are used in the drawings and the description to refer to the same or like parts.

Please referring to FIG. 1, FIG. 1 is a block diagram of a delay line ring oscillation apparatus 100 according to an embodiment of the present disclosure. The delay line ring oscillation apparatus 100 may be used in any synchronous electronic devices, including dynamic random access memory (DRAM). The delay line ring oscillation apparatus 100 includes a two gates logical circuit 110, a buffer 120, a clock input buffer 130 and a delay lock loop circuit 140. The two gates logical circuit 110 has three input ends and an output end, the three input ends of the two gates logical circuit 110 respectively receive a clock enable signal CLKENB, a specific mode signal SPCMD, and a delayed clock output signal DCK. The two gates logical circuit 110 performs a logical operating on the clock enable signal CLKENB, the specific mode signal SPCMD and the delayed clock output signal DCK for generating a mode selecting signal MSS on the output end of the two gates logical circuit 110.

The buffer 120 is coupled to the two gates logical circuit 110 and the clock input buffer 130. The buffer 120 receives the mode selecting signal MSS from the two gates logical circuit 110, the buffer 120 also receives a control signal CTRL. The buffer 120 generates a feedback signal FB according to the mode selecting signal MSS and the control signal CTRL, wherein, a frequency of the feedback signal FB may be adjusted according to the control signal CTRL.

The clock input buffer 130 is coupled between the buffer 120 and the delay lock loop circuit 10. The clock input buffer 130 receives the feedback signal FB and a input clock signal CKIN. The clock input buffer 130 decides whether to transport the input clock signal CKIN to an output end of the clock input buffer 130 or not according to the feedback signal FB.

The delay lock loop circuit 140 is coupled to the clock input buffer 130 and the two gates logical circuit 110. The delay lock loop circuit 140 receives and delays the signal on the output end of the clock input buffer 130 for generating the delayed clock output signal DCK. Besides, the delay lock loop circuit 140 also generates another delayed clock output signal DCKOUT, and the delayed clock output signal DCKOUT may be presented by a differential signal pair.

In detail, the two gates logical circuit 110 may perform an OR operation on the specific mode signal SPCMD and the delayed clock output signal DCK to obtain a first result. The two gates logical circuit 110 also performs a NAND operation on the first result and the clock enable signal CLKENB to obtain the mode selecting signal MSS. Please notice here, the two gates logical circuit 110 includes only two logic gates.

About the operation of the delay line ring oscillation apparatus 100, during the delay lock loop circuit 140 is in normal operation, the clock enable signal CLKENB is in logic low voltage level and the specific mode signal SPCMD is in high logic voltage level. Therefore, the mode selecting signal MSS is in logic high voltage level. Accordingly, the buffer 120 receives the mode selecting signal MSS which is held on logic high voltage level, and the buffer 120 generates the feedback signal FB which is also held on logic high voltage level. The clock input buffer 130 receives the feedback signal FB which is also held on logic high voltage level, and the input clock signal CKIN may be transported to the delay lock loop circuit 140 by the clock input buffer 130.

In the embodiment of the disclosure, the clock input buffer 130 may invert the input clock signal CKIN to transport the inverted input clock signal to the delay lock loop circuit 140.

On the other case, during the delay lock loop circuit 140 is on in protection operation (for example, when the DRAM is in a power down mode, a self-refresh mode or in a NBTI (negative bias temperature instability) test mode), the specific mode signal is in logic low voltage level and the clock enable signal CLKENB is in high logic level. At this time, the gate numbers of the two gates logical circuit 110, the buffer 120 and the clock input buffer 130 is odd, and a circuit loop formed by the two gates logical circuit 110, the buffer 120, the clock input buffer 130 and the delay lock loop circuit 140 performs a ring oscillator, and the ring oscillator starts slow oscillation with a stable duty cycle about 50%. That is, the duty cycle of the delayed clock output signal DCKOUT generated by the delay lock loop circuit 140 is 50%.

It should be notice here, the frequency of the feedback signal FB may be adjusted by the buffer 120 according to the control signal CTRL. That is, the frequency of the delayed clock output signal DCKOUT may be adjusted correspondingly.

The delayed clock output signal DCKOUT may be transported to all the rest delay lock loop circuit, the clock tree, the delay compensation circuit and the delay lock feedback circuit model, and all the rest delay lock loop circuit, the clock tree, the delay compensation circuit and the delay lock circuit feedback model can receive the slow oscillation signal with 50% duty cycle. That is, the delay lock loop circuit 140 is protected form asymmetrical NBTI degradation. Meanwhile, the delay line ring oscillation apparatus 100 consumes much less power due to the very slow oscillation frequency of the delayed clock output signal DCKOUT.

Figure 2:
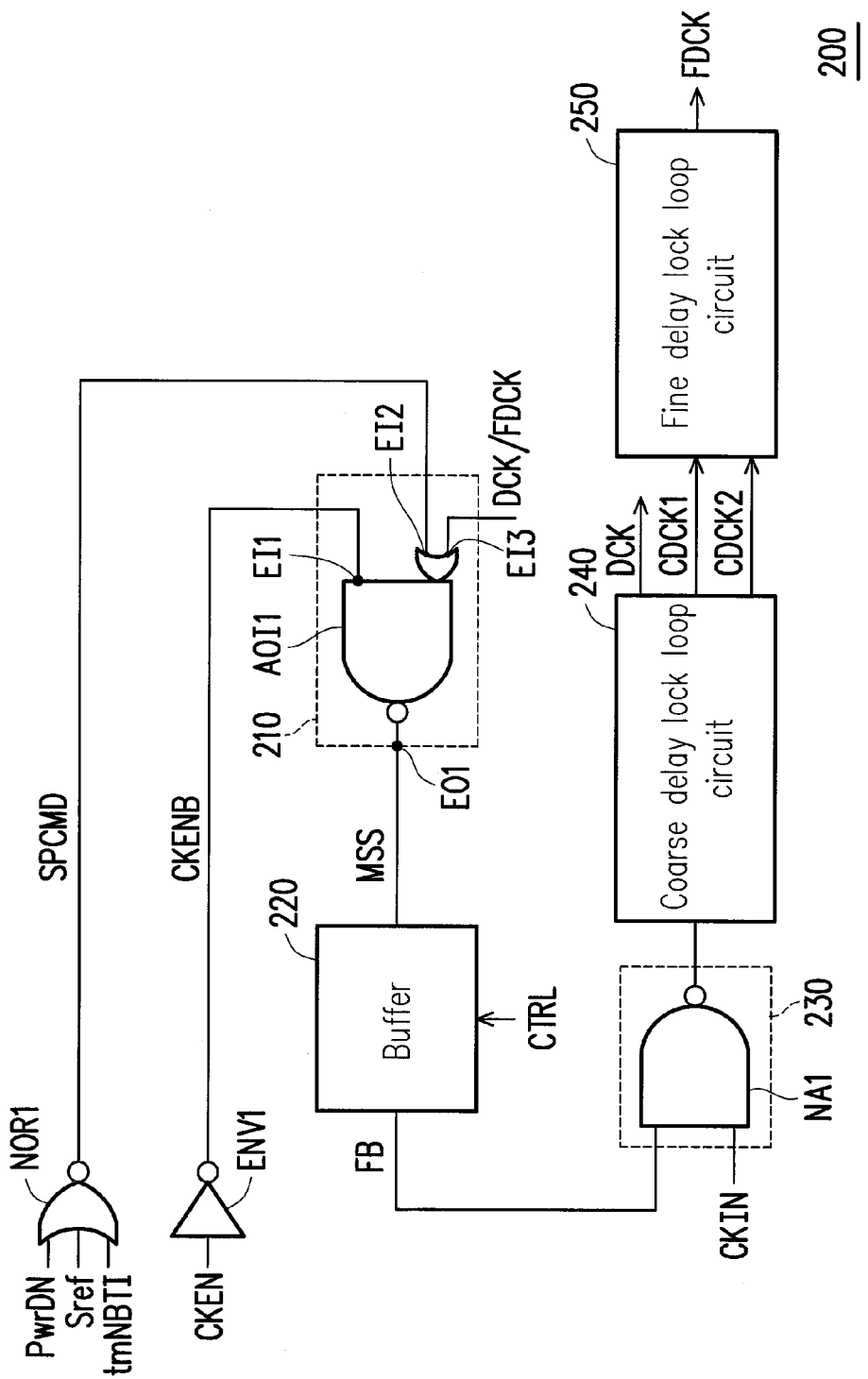
FIG. 2 is a block diagram of a delay line ring oscillation apparatus 200 according to another embodiment of the present disclosure.

Please referring to FIG. 2, FIG. 2 is a block diagram of a delay line ring oscillation apparatus 200 according to another embodiment of the present disclosure. The delay line ring oscillation apparatus 200 includes a NOR gate NOR1, an inverter INV1, a two gates logical circuit 210, a buffer 220, a clock input buffer 230, a coarse delay lock loop 240 and a fine delay lock loop 250. In the embodiment, the two gates logical circuit 210 is an and-or-inverter (AOI) gate AOI1, wherein, the AOI gate AOI1 has a NAND input end EI1, a first OR input end EI2 and a second OR input end EI3, and an AOI output end EO1. The NAND input end EI1 is used to receive a clock enable signal CLKENB, the first OR input end EI2 is used to receive a specific mode signal SPCMD, and the second OR input end EI3 is used to receive a delayed clock output signal DCK or a fine delayed output signal FDCK. The AOI output end EO1 is used to generate a mode selecting signal MSS.

On the other hand, the clock input buffer 230 is a NAND gate NA1. The input ends of the NAND gate NA1 receive the feedback signal FB and the input clock signal CKIN. The output end of the NAND gate NA1 is coupled to the coarse delay lock loop circuit 240.

The coarse delay lock loop circuit 240 is also coupled to the fine delay lock loop circuit 250. The coarse delay lock loop circuit 240 generates coarse delayed output signal pair CDCK1 and CDCK2, and the coarse delayed output signal pair CDCK1 and CDCK2 are transported to an input end pair of the fine delay lock loop circuit 250. The fine delay lock loop circuit 250 generates the fine delayed output signal FDCK according to the coarse delayed output signal pair CDCK1 and CDCK2. Wherein, the coarse delayed output signal CDCK1 and CDCK2 are differential signals.

The NOR gate NOR1 has three input ends in this embodiment. The input ends of the NOR gate NOR1 respectively receive a power down signal PwrDN, a self-refresh signal Sref and a test mode for negative bias temperature instability (NBTI) signal tmNBTI. The NOR gate NOR1 is used to generate the specific mode signal SPCMD.

When at least one of the power down signal PwrDN, the self-refresh signal Sref and the test mode for NBTI signal tmNBTI is in logic high voltage level, the specific mode signal SPCMD is in logic low voltage level, and when all of the power down signal PwrDN, the self-refresh signal Sref and the test mode for NBTI signal tmNBTI is in logic low voltage level, the specific mode signal SPCMD is in logic high voltage level.

The inverter IV1 is coupled to the AOI gate AOI1. The inverter IV1 receives a signal CLKEN and inverts the signal CLKEN to generate the clock enable signal CLKENB. The clock enable signal CLKENB is provided to the NAND input end EI1 to the AOI gate AOI1.

Figure 3:
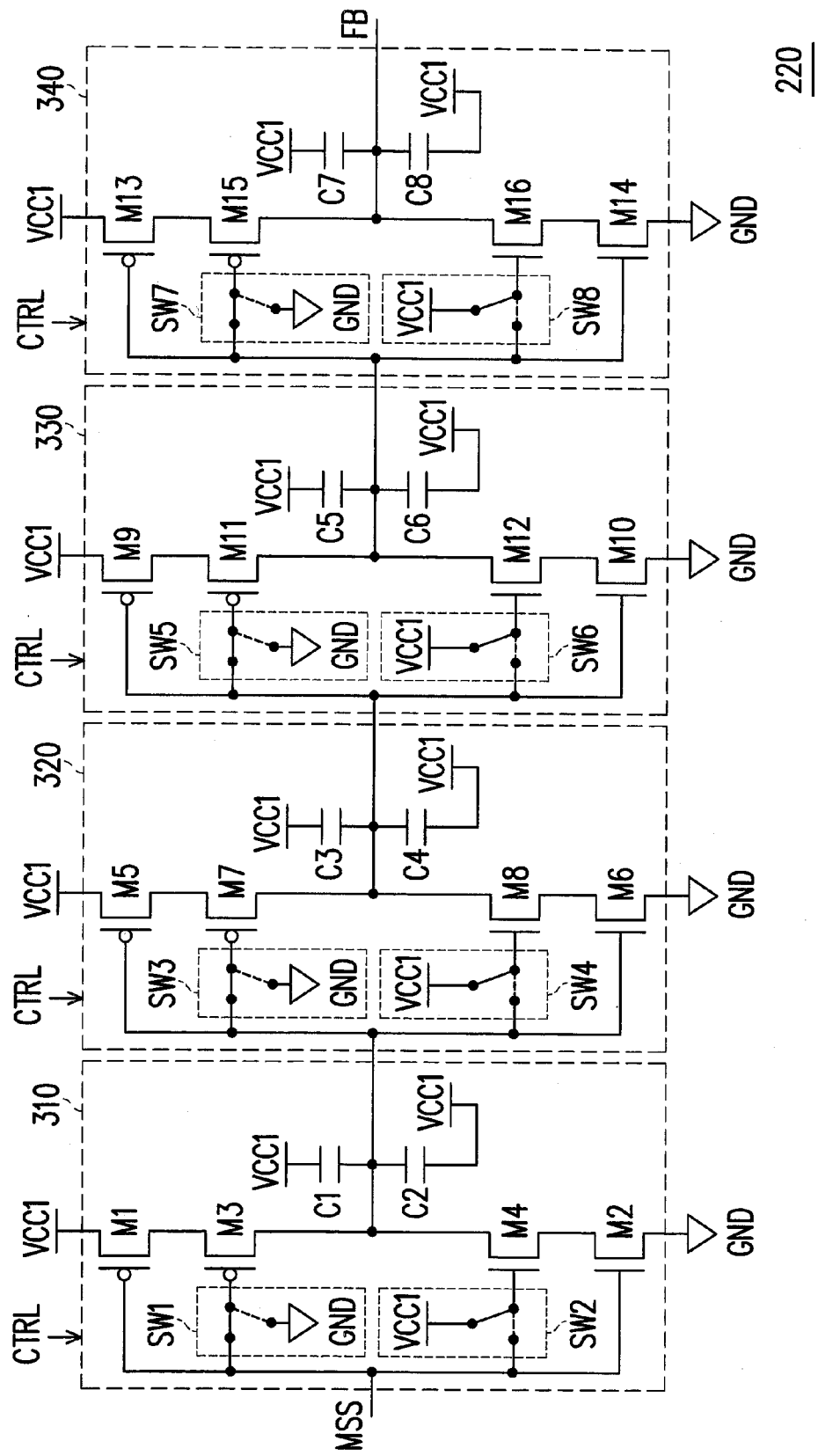
FIG. 3 is a circuit diagram of the buffer 220 according to the embodiment of the present disclosure.

Please referring to FIG. 3, FIG. 3 is a circuit diagram of the buffer 220 according to the embodiment of the present disclosure. The buffer 220 includes a plurality of inverting gates 310-340. The inverting gates 310-340 are coupled in series. The inverting gate 310 includes transistors M1-M4, switches SW1 and SW2 and capacitors C1 and C2. The inverting gate 320 includes transistors M5-M8, switches SW3 and SW4 and capacitors C3 and C4. The inverting gate 330 includes transistors M9-M12, switches SW5 and SW6 and capacitors C5 and C6. The inverting gate 340 includes transistors M13-M16, switches SW5 and SW6 and capacitors C5 and C6.

In inverting gate 310, a first end of the transistor M1 is coupled to a first reference voltage VCC1, and a second end of the transistor M1 is coupled to a first end if the transistor M3. Control ends of the transistors M1 and M2 are coupled together to form an input end of the inverting gate 310. A second end of the transistor M2 is coupled to a first end of the transistor M4 and forms an output end of the inverting gate 310. A second end of the transistor M4 is coupled to a first end of the transistor M2. A second end of the transistor M2 is coupled to a second reference voltage GND. The first reference voltage VCC1 may be an operation voltage of the buffer 220, and the second reference voltage GND may be a ground voltage of the buffer 220.

The switch SW1 is coupled between the input end of the inverting gate 310 and a control end of the transistor M3. The switch SW1 is used to connect the control end of the transistor M3 to the input end of the inverting gate 310 or to the second reference voltage GND according to the control signal CTRL. The switch SW2 is coupled between the input end of the inverting gate 310 and a control end of the transistor M4. The switch SW2 is used to connect the control end of the transistor M4 to the input end of the inverting gate 310 or to the first reference voltage VCC1 according to the control signal CTRL. The input end of the inverting gate 310 is used to receive the mode selecting signal MSS.

The statuses of the switches SW1 and SW2 are complementary. That is, when the switch SW1 connects the control end of the transistor M3 to the input end of the inverting gate 310, the switch SW2 connects the control end of the transistor M4 to the first reference voltage VCC1. On the contrary, when the switch SW1 connects the control end of the transistor M3 to the second reference voltage GND, the switch SW2 connects the control end of the transistor M4 to the input end of the inverting gate 310.

The capacitor C1 is coupled between the output end of the inverting gate 310 and the first reference voltage VCC1. The capacitor C2 is also coupled between the output end of the inverting gate 310 and the first reference voltage VCC1.

All of the circuits of the inverting gates 310-340 are the same, and the detail circuit structure of each of the inverting gate 320-340 are not described here. Beside, the output end of the inverting gate 340 generates the feedback signal FB. The buffer 220 may generate the feedback signal FB by adjusting the frequency of the mode selecting signal MSS according to the control signal CTRL. The number of the inverting gates may be changed according to the frequency of the mode selecting signal MSS, four inverting gates 310-340 used in the buffer 220 is only an example.

In the embodiment, the transistors M1, M3, M5, M7, M9, M11, M13 and M15 are P-type transistors, and the M2, M4, M6, M8, M10, M12, M14 and M16 are N-type transistors.

Figure 4A:
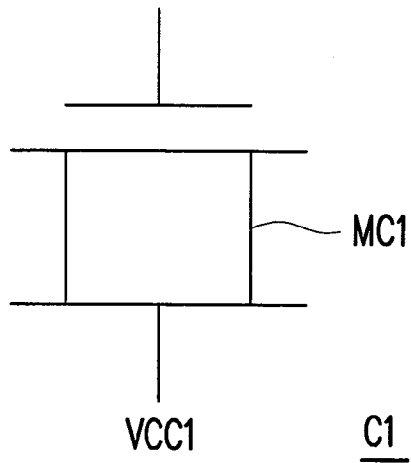
FIG. 4A and FIG. 4B respectively are circuit diagrams of the capacitors C1 and C2 according to the embodiment of the present disclosure.
Figure 4B:
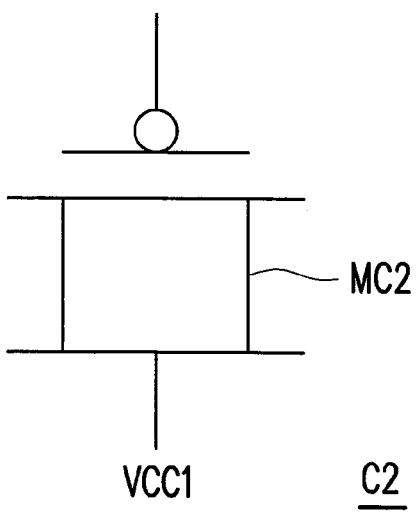

Please referring to FIG. 4A and FIG. 4B, FIG. 4A and FIG. 4B respectively are circuit diagrams of the capacitors C1 and C2 according to the embodiment of the present disclosure. The capacitors C1 and C2 may be formed by transistors. The capacitors C1 is formed by a N-type transistor MC1, and a drain and a source of the N-type transistor MC1 are coupled to the first reference voltage VCC1, and a gate of the N-type transistor MC1 is coupled to the output end of the inverting gate 310. The capacitors C2 is formed by a P-type transistor MC2, and a drain and a source of the P-type transistor MC2 are coupled to the first reference voltage VCC1, and a gate of the P-type transistor MC2 is coupled to the output end of the inverting gate 310.

In summary, the present disclosure provides the delay line ring oscillation apparatus with the two gates logical circuit, a buffer and a clock input buffer to form a loop, and the loop is used to generate a slow oscillation signal with 50% duty ratio. Such as that, the asymmetrical degradation stress problem of the delay line ring oscillation apparatus can be solved, and the system performance can be extended by making the delay line ring oscillation apparatus safe from negative bias temperature instability (NBTI) and/or positive bias temperature instability (PBTI) hazard.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A delay line ring oscillation apparatus, comprising:
a two gates logical circuit, having three input ends and an output end, two of the three input ends respectively receiving a clock enable signal and a specific mode signal, and the third input end further receiving a delayed clock output signal or a fine delayed output signal, the two gates logical circuit performing a logical operating on the clock enable signal, the specific mode signal and one of the delayed clock output signal and the fine delayed output signal for generating a mode selecting signal on the output end of the two gates logical circuit;
a buffer, receiving the mode selecting signal and generating a feedback signal according to the mode selecting signal and a control signal;
a clock input buffer, receiving the feedback signal and a input clock signal, the clock input buffer deciding whether to transport the input clock signal to an output end of the clock input buffer or not according to the feedback signal; and
a delay lock loop circuit, receiving and delaying the signal on the output end of the clock input buffer for generating the delayed clock output signal,
wherein, a frequency of the feedback signal is adjusted according to the control signal.

2. The delay line ring oscillation apparatus according to claim 1, wherein the two gates logical circuit is an and-or-inverter (AOI) gate, the AOI gate has a NAND input end, a first OR input end and a second OR input end, and an AOI output end, the NAND input end receives the clock enable signal, the first OR input end receives the specific mode signal, and the second OR input end receives the delayed clock output signal or the fine delayed output signal.

3. The delay line ring oscillation apparatus according to claim 1, wherein the clock input buffer is a NAND gate, the NAND gate has a first input end a second input end and an output end, the first input end of the NAND gate receives the feedback signal, the second input end of the NAND gate receives the input clock signal, and the output end of the NAND is coupled to the delay lock loop circuit.

4. The delay line ring oscillation apparatus according to claim 1, wherein the delay lock loop circuit is a coarse delay lock loop circuit.

5. The delay line ring oscillation apparatus according to claim 4, further comprising:
a fine delay lock loop circuit, having an input end pair, the input end pair being coupled to the coarse delay lock loop circuit, the fine delay lock loop circuit receiving a coarse delayed output signal pair from the coarse delay lock loop circuit through the input end pair, and the fine delay lock loop circuit generating the fine delayed output signal according to the coarse delayed output signal pair.

6. The delay line ring oscillation apparatus according to claim 1, further comprising:
a NOR gate, coupled to the two gates logical circuit, wherein the NOR gate receives a power down signal, a self-refresh signal and a test mode for negative bias temperature instability (NBTI) signal, the NOR gate is used to generate the specific mode signal.

7. The delay line ring oscillation apparatus according to claim 1, wherein the buffer comprises:
a plurality of inverting gates, the inverting gates are coupled in series, the first inverting gate receives the mode selecting signal, and the last inverting gate generates the feedback signal, each of a plurality of gate delays of each of the inverting gates is controlled by the control signal.

8. The delay line ring oscillation apparatus according to claim 7, wherein each of the inverting gates comprises:
a first transistor, has a first end, a second end and a control end, the first end of the first transistor is coupled to a first reference voltage, the control end of the first end is an input end of the inverting gate;
a second transistor, has a first end, a second end and a control end, the control end of the second transistor is coupled to the control end of the first transistor, the second end of the second transistor is coupled to a second reference voltage;
a third transistor, has a first end, a second end and a control end, the first end of the third transistor is coupled to the second end of the first transistor, the second end of the third transistor is an output end of the inverting gate;
a first switch, coupled between the input end of the inverting gate and the control end of the third transistor, the first switch is used to connect the control end of the third transistor to the input end of the inverting gate or the second reference voltage according to the control signal;
a fourth transistor, has a first end, a second end and a control end, the first end of the fourth transistor is coupled to the output end of the inverting gate, the second end of the fourth transistor is coupled to the first end of the second transistor; and
a second switch, coupled between the input end of the inverting gate and the control end of the fourth transistor, the second switch is used to connect the control end of the fourth transistor to the input end of the inverting gate or the first reference voltage according to the control signal.

9. The delay line ring oscillation apparatus according to claim 8, wherein each of the inverting gates further comprises:
a first capacitor, coupled between the output end of each of the inverting gates and the first reference voltage; and
a second capacitor, coupled between the output end of each of the inverting gates and the first reference voltage.

10. The delay line ring oscillation apparatus according to claim 9, wherein the first capacitor is formed by a N-type transistor, the second capacitor is formed by a P-type transistor.

11. The delay line ring oscillation apparatus according to claim 8, wherein the first transistor and the third transistor are P-type transistors, the second transistor and the fourth transistor are N-type transistors.

12. The delay line ring oscillation apparatus according to claim 8, wherein when the first switch connects the control end of the third transistor to the input end of the inverting gate, the second switch connects the control end of the fourth transistor to the first reference voltage, when the first switch connects the control end of the third transistor to the second reference voltage, the second switch connects the control end of the fourth transistor to the input end of the inverting gate.

13. The delay line ring oscillation apparatus according to claim 8, wherein the amount of the inverting gates of the buffer is even.

* * * * *